United States Patent [19]
Anderson

[11] Patent Number: 4,608,538
[45] Date of Patent: Aug. 26, 1986

[54] FM QUADRATURE DETECTOR WITH FERRITE BEAD TUNED CIRCUIT

[75] Inventor: Keith V. Anderson, Rural Meade County, S. Dak.

[73] Assignee: Anderson Scientific, Black Hawk, S. Dak.

[21] Appl. No.: 558,920

[22] Filed: Dec. 7, 1983

[51] Int. Cl.⁴ .......................... H03D 3/00; H03D 3/26
[52] U.S. Cl. ................................. 329/103; 329/110;
329/116; 329/137; 329/140; 329/145; 329/160;
333/175; 333/185
[58] Field of Search ............... 329/103, 110, 116, 126,
329/137, 138, 140, 145, 160; 333/175, 176, 185;
455/214, 337

[56] References Cited
U.S. PATENT DOCUMENTS

| | | | |
|---|---|---|---|
| 3,051,891 | 8/1962 | Jorgensen | 333/175 X |
| 3,699,272 | 10/1972 | Fritz | 333/185 X |
| 4,232,268 | 11/1980 | Hinn | 329/103 |
| 4,255,728 | 3/1981 | Doty | 333/185 X |
| 4,375,618 | 3/1983 | Jett | 329/103 |

FOREIGN PATENT DOCUMENTS

0072405  5/1982  Japan .................................. 329/110

OTHER PUBLICATIONS

FM Stereo/Quad Receiver Servicing Manual, ©1974, Carr, pp. 51–52.
Radio Handbook, 22nd Edition, Orr, 1981, p. 13.17.
Advanced Electronic Troubleshooting, D. Cameron, ©1977, p. 63.
"IF Amplifier and Quadrature Detector", MC 1357 Integrated Circuit Data Sheet, pp. 5-73–5-78.

Primary Examiner—Eugene R. LaRoche
Assistant Examiner—D. C. Mis
Attorney, Agent, or Firm—Dorsey & Whitney

[57] ABSTRACT

A quadrature detector circuit for demodulating frequency modulated information is provided that is particularly designed for use in television receive only (TVRO) satellite communication video receivers. The bandwidth restrictions of conventional quadrature detector circuits are eliminated by substituting a simple ferrite bead for the usual parallel capacitor, inductor, resistor combination heretofore required in quadrature detectors. The quadrature detector hereof produces a higher level of video output, improved linearity, and better selectivity, as compared to conventional quadrature detector circuits. Moreover, the quadrature detector hereof reduces circuit complexity, and decreases material costs and production time.

8 Claims, 7 Drawing Figures

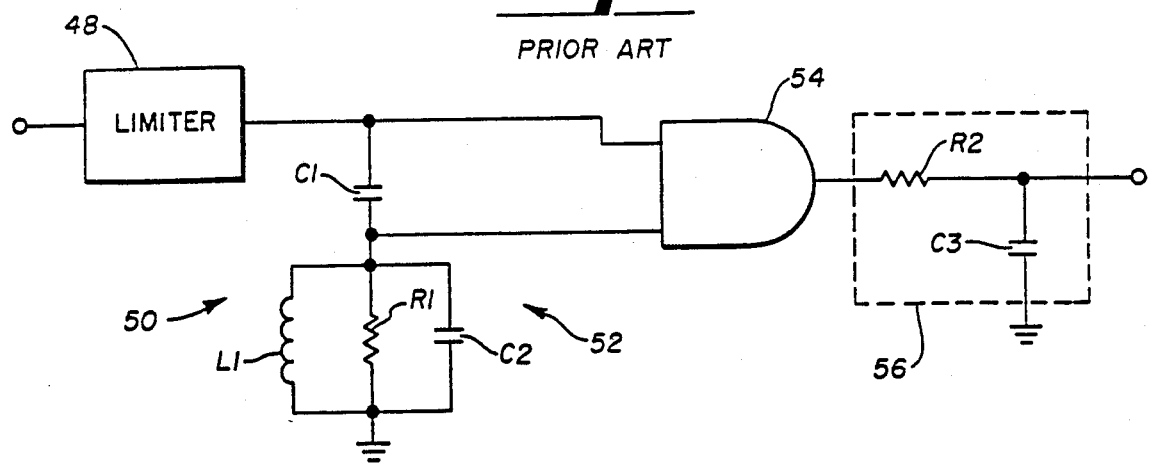
Fig. 4
PRIOR ART
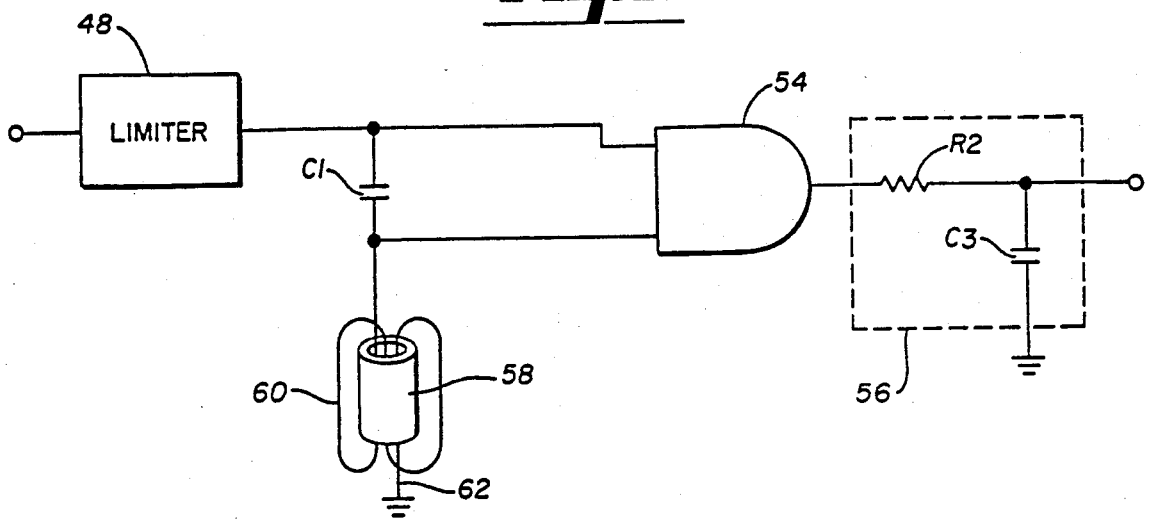
Fig. 5
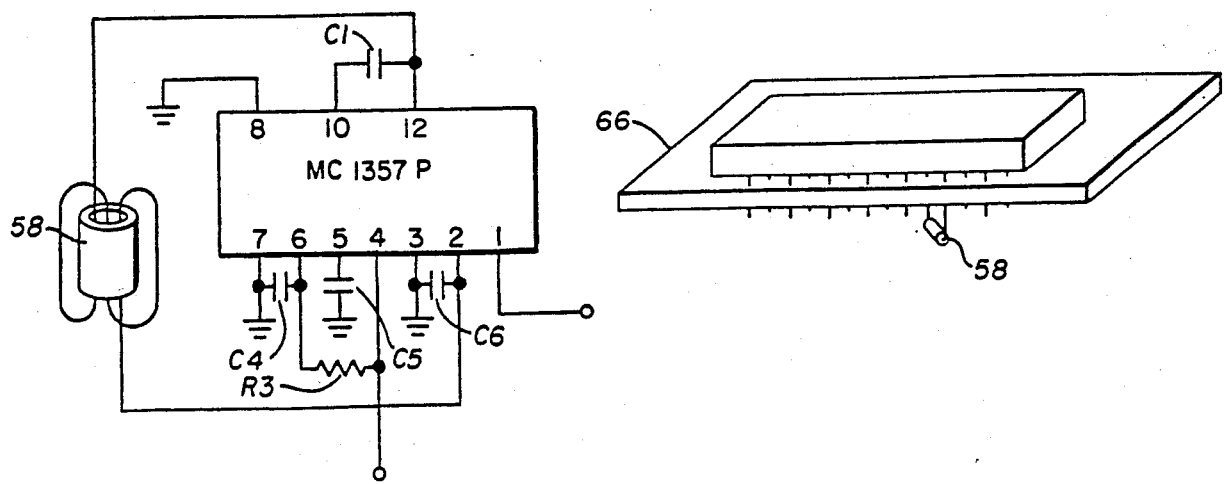
Fig. 6
Fig. 7

FM QUADRATURE DETECTOR WITH FERRITE BEAD TUNED CIRCUIT

FIELD OF THE INVENTION

This invention pertains to television receive-only (TVRO) earth station terminals. In particular, the invention pertains to an improved FM quadrature detector for the receiver of a TVRO that is easier and cheaper to manufacture, and which produces a higher level of video output, improved linearity and better selectivity, as compared to conventional quadrature detector circuits.

BACKGROUND OF THE INVENTION

Strong consumer interest in home satellite TV reception has instigated research by electronics manufacturers for better performing, more cost-effective, TVRO earth station terminals. A TVRO terminal is the down-link system in a typical satellite television system which includes four major components: a television studio for generating TV signals, an up-link earth station for communicating the TV signals into space, a geostationary communication satellite for receiving the TV signals and for retransmission of the signals to the earth, and the TVRO for receiving and converting the signals into audio and video displays.

The TVRO earth station terminal includes six major components: a directional dish receiving antenna, a low noise preamplifier (LNA), a frequency down converter, a satellite TV receiver, a VHF remodulator, and a conventional television set.

Satellite TV signals are transmitted on a frequency modulated signal, and as such the satellite TV receiver must include a detector responsive to frequency modulated transmissions. Experience with conventional television receivers has shown that quadrature, or coincidence, detectors are good detectors for frequency modulated signals.

With the advent of integrated circuits, several electronics manufacturers have provided quadrature detector integrated circuits. Heretofore, however, such integrated circuit chips have been in the most part limited in their application to the detection of frequency modulated signals carrying sound information. The applications have been so limited because the chips require an external tuned circuit to provide the phase shift essential for quadrature detection. In order to accommodate the broad bandwidth required of an FM signal carrying video information, the shunt resistance of the tuned circuit must be decreased, to broaden the responsive bandwidth of the tuned circuit. At the same time, however, the decrease in shunt resistance of the tuned circuit lowers the output power of the detector, and detracts from the selectivity of the circuit.

A quadrature detector circuit that could incorporate standard integrated circuit chips, and that could detect across a bandwidth suitable for demodulating video information on a frequency modulated carrier wave, without decreasing the power out of the detector or reducing its linearity, would be a decided advantage.

SUMMARY OF THE INVENTION

The problems outlined above are in large measure solved by the FM ferrite quadrature detector in accordance with the present invention. That is to say, the quadrature detector circuit hereof incorporates a standard integrated circuit chip into a quadrature detector suitable for the detection of frequency modulated video information.

In particular, the FM ferrite quadrature detector hereof substitutes a ferrite bead with a specified number of turns of wire therethrough for the conventional parallel resistor, inductor, and capacitor tuned circuit. The use of the ferrite bead as disclosed herein in place of a conventional tuned circuit provides a quadrature detector suitable for the demodulation of video information carried by a frequency modulated signal, with improved power out, linearity, and selectivity characteristics over conventional circuits, while decreasing material costs, production time, and circuit complexity.

BRIEF DESCRIPTION OF THE DRAWINGS

FIG. 4 is a schematic diagram of a conventional quadrature detector;

FIG. 5 is a schematic diagram of a quadrature detector circuit in accordance with the present invention;

FIG. 6 is a schematic diagram of a quadrature detector circuit in accordance with the present invention incorporating a ferrite bead with an MC1357P integrated circuit chip; and FIG. 7 is a perspective view of a quadrature detector circuit in accordance with the present invention incorporating a ferrite bead with an MC1357P integrated circuit.

DETAILED DESCRIPTION

Figure 1:
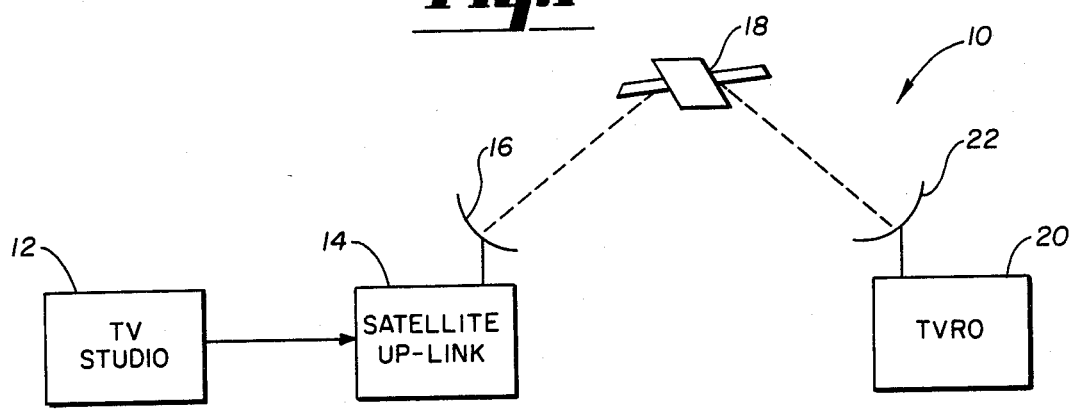
FIG. 1 is a block diagram of a satellite television communication system.

Referring to the drawings, a standard satellite television system will be described in a general manner to enhance the understanding of a particular application for the ferrite bead quadrature detector. Moreover, the structure and operation of a standard quadrature detector will be explained so that the problems associated with adapting a quadrature detector for video FM demodulation by conventional techniques can be appreciated.

Referring to FIG. 1, the four major parts of a satellite TV communication system 10 are depicted in block diagram format. A typical satellite television system 10 includes a television studio 12 where TV signals are generated, an up-link earth station 14 including transmit antenna 16, a communication satellite 18 in geostationary position, and a down-link station comprising a television receive only (TVRO) earth terminal 20 including receiving antenna 22. The transmit and receive antennas 16, 22 are pointed directly at the satellite 18.

Figure 2:
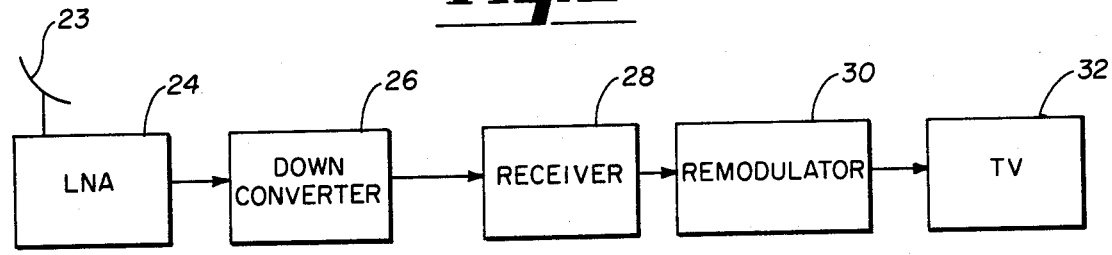
FIG. 2 is a block diagram of a television receive only (TVRO) earth station terminal of a television satellite communication system.

Referring to FIG. 2, a typical TVRO earth terminal is depicted in block diagram format. The TVRO terminal 20 includes receive antenna 22, low noise amplifier (LNA) 24, down converter 26, receiver 28, remodulator 30, and a conventional TV console display 32.

The receive antenna 22 is preferably a parabolic, or dish, antenna and typically varies from about 8 to 15 feet in diameter. The antenna is mounted on a base such that it may be shifted both in elevational angle and azimuth so that the focal point of the antenna may be correctly oriented in line with a selected satellite.

The low noise amplifier (LNA) 24 is typically connected as close to the antenna 22 as possible. The LNA comprises an extremely sensitive high frequency transistor amplifier that can amplify extraordinarily weak signals received from the satellite 18, without generating self noise that would swamp the intelligence signal received from the satellite. In this regard it will be appreciated that satellite signals received by the antenna 22 are typically less than one-millionth as strong as the signals received by a television receiver from conventional television broadcasting stations.

Figure 3:
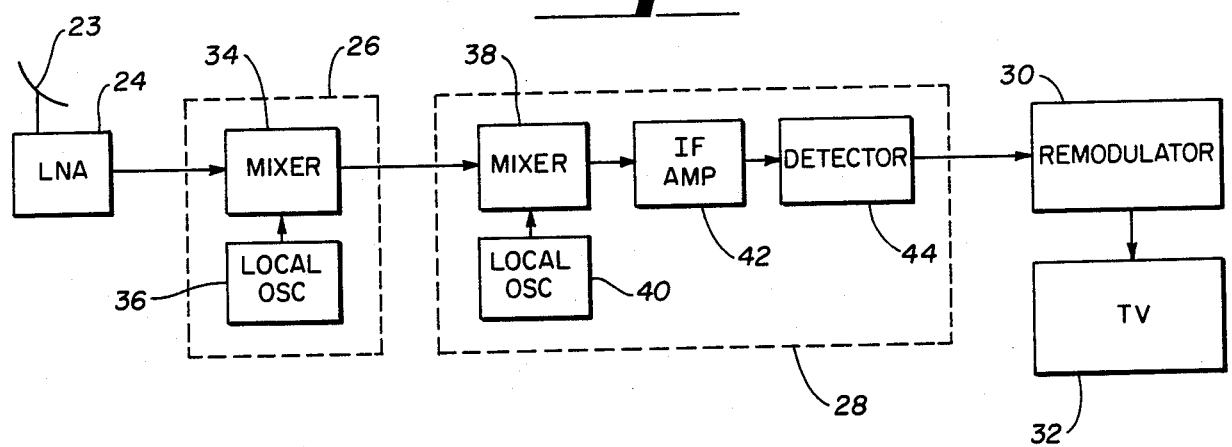
FIG. 3 is a block diagram of a TVRO system depicting the down converter and receiver in greater detail than shown in FIG. 2.

The down converter 26 is also typically mounted as close as possible to the receive antenna 22 to minimize transmission signal losses between the LNA 24 and the down converter 26. As depicted in FIG. 3, the down converter comprises a mixer 34 and local oscillator 36 for converting the extremely high frequency satellite signal (in the range of 3.7 to 4.2 GHz) to a first intermediate frequency range of from about 430 MHz to 930 MHz.

The intermediate frequency output signal from the down converter is the input to the receiver 28. The receiver 28 includes a second mixer 38 and local oscillator 40, an intermediate frequency amplifier 42, and detector 44. The second mixer reduces the first intermediate frequency signal from the 430 to 930 MHz range to a second intermediate frequency centered at about 45 MHz. The output of the receiver 28 is a demodulated signal which could be directly applied to a standard TV receiver by hard wire connections within the TV chassis. It is more convenient, however, to remodulate the output of the detector 44 to a signal that can be directly applied to the antenna terminal of a conventional TV receiver. The output of the detector 44, therefore, is sent to remodulater 30 before it is coupled to the TV 32. As will be appreciated by those skilled in the art, the TVRO terminal requires a receiver separate from the receiver circuit of the TV console because the satellite TV signal comprises frequency modulated video and audio information, and conventional TV consoles are configured to receive frequency modulated audio information and amplitude modulated video information.

Referring to FIG. 4, the structure of a conventional quadrature detector will be described. The conventional detector includes a limiter 48 for clipping the input IF signal to essentially a square wave with reduced amplitude variations; phase shifting circuitry 50 comprising a first capacitor C1 and a tuned tank 52; a coincidence, or "and", gate 54; and an integrator circuit 56. The tuned tank 52 includes a conventional inductor L1, resistor R1 (the shunt resistance), and capacitor C2 in parallel. Typical values for L1, R1 and C1 are about 0.12 microhenrys, 47 ohms, and 100 picofarads, respectively. The coincidence gate 54 comprises a logical "and" gate. The integrator circuit 56 includes a resistor R2 and capacitor C3 in series.

Referring to FIGS. 5, 6 and 7, the structure of a quadrature detector in accordance with the present invention will now be described. Referring first to FIG. 5, it will be seen that a detector 44 in accordance with the present invention includes a limiter 48, a phase shifting capacitor C1, coincidence gate 54, and integrator circuit 56 similar to those described above in accordance with the conventional quadrature detector. Similar components, therefore, are indicated by similar numerals. The tuned tank 52 of the conventional quadrature detector 46 is replaced in the present invention, however, by a ferrite bead 58 having a plurality of turns of wire 60 received therethrough. The wire 60 is connected at one end to ground terminal 62 and at the other end thereof to capacitor C1 and one input of the coincidence gate 54. The ferrite bead 58 may advantageously be an Amidon type 43-101 bead which can be obtained from Amidon & Associates, 12033 Otsego Street, North Hollywood, Calif. 91607. The wire 60 preferably comprises 28 gauge plastic insulated solid copper wire. Preferably two complete turns of wire 60 are received through the bead.

Turning now to FIGS. 6 and 7, a quadrature detector 44 in accordance with the present invention is depicted wherein a Motorola MC1357P IF Amplifier and Quadrature Detector, silicon monolithic integrated circuit chip, is coupled with a ferrite bead 58 to comprise a quadrature detector in accordance with the present invention. The MC1357P chip may be obtained from the Motorola Corporation, P.O. Box 20912, Phoenix, Ariz. 85036-0912. The wire 60 received through the bead 58 is connected to terminals 2 and 12 of the MC1357P, by leads advantageously less than one centimeter each in length, and phase shifting capacitor C1 is connected between the terminals 10 and 12. Capacitors C4, C5, C6 and resistor R3 are connected to terminals of the MC1357P as shown to provide appropriate feedback and isolation for proper operation of the quadrature detector. IF input is provided at pin 4 of the chip, with the output taken from pin 1.

In FIG. 7, the chip is depicted as mounted on a standard circuit board 66. The ferrite bead 58 is located on the opposite side of the board 66 from the chip 64.

The operation of a quadrature detector circuit will now be described. The intermediate frequency output signal of the IF amplifier 42 is directed to the limiter 48 of detector 44. The limiter 48 hard limits the IF signal to a train of square wave pulses. A reference portion ($V_L$) of the square wave output of the limiter 48 is provided directly to "and" gate 54, with the other, variable, portion ($V_{ps}$) of the signal directed to the phase shifting circuitry 50.

The tank 52 is tuned to resonate at the center IF frequency (45 MHz). At 45 MHz (and with appropriate values for L1 and C2), the inductive and capacitive reactances of inductor L1 and capacitor C2 cancel each other, and the tuned tank 52 is purely resistive. The output signal of the tank 52 ($V_{ps}$), therefore, is essentially a sine wave at the IF frequency, nominally 90° out of phase (due to the presence of C1) with the square wave output ($V_L$) of limiter 48. (As will be appreciated by those skilled in the art, as $R_1$ is increased relative to C1, the phase shift of $V_{ps}$ relative to $V_L$ will approach zero; as $R_1$ is decreased relative to $C_1$ the phase shift will approach 90°—hence the term "quadrature").

The tuned tank 52 will become inductively reactive at frequencies higher than the intermediate frequency, and will become capacitively reactive at frequencies below the intermediate frequency. The phase shift between $V_{ps}$ and $V_L$, therefore, will accordingly become greater than or less than 90°. The amount of the phase shift from 90° of $V_{ps}$ relative to $V_L$ will correspond, in approximately linear relationship, to the degree in which the frequency of $V_L$ and $V_{ps}$ vary from the center IF frequency (the frequency at which the tuned tank 52 resonates). Since information on a frequency modulated wave is represented by changes in frequency from a specified center frequency, and the amount of phase shift of $V_{ps}$ relative to $V_L$ shifts with changes in frequency, it will be appreciated that the amount of phase shift in $V_{ps}$ will correlate directly to the information carried by the frequency modulated carrier signal.

Both $V_L$ and $V_{ps}$ are provided to the input terminals of "and" gate 54. "And" gate 54 will have a positive output only when the signals at both of its input terminals are positive. It will be understood that the pulse width of $V_L$ is one-half the IF period. At the IF frequency, since the phase difference between $V_L$ and $V_{ps}$ is approximately 90°, $V_L$ and $V_{ps}$ will both be positive at the same time, or coincide, for one-fourth of the IF period. The output of "and" gate 54 will therefore be a square wave or pulse having a pulse width of one-fourth the IF frequency period. Those skilled in the art will also appreciate that, as the phase shift of $V_{ps}$ relative to $V_L$ varies about 90°, the output of "and" gate 54 will comprise a square wave having a pulse width varying from zero, when the phase shift between $V_L$ and $V_{ps}$ is 180°, to one-half the IF frequency period when the phase shift is 0°. Phase shifts of greater than 180° or less than 0° are to be avoided, since they would produce outputs at the "and" gate 54 varying from, again, between zero pulse width to a pulse width of one-half the IF frequency period. Such output would provide ambiguous information as compared with pulse widths generated by phase shifts between zero and 180°.

The output of "and" gate 54 is provided to the RC integrator 56. The integrator output voltage is proportional to the average value of the input pulse train received from the output of "and" gate 54, and is therefore proportional to the frequency deviation of the input frequency from the center intermediate frequency (45 MHz).

The conventional tuned tank 52 of a conventional quadrature detection circuit typically requires a relatively high Q factor. The high Q factor is required to provide the requisite power out and detection linearity. To accommodate video information, however, the Q factor of the tuned tank must be reduced, thereby broadening the bandwidth detectable by the quadrature detector. The Q factor is effectively reduced by paralleling the coil and capacitor with a small shunt resistance (R1). The shunt resistor, however, has the disadvantage of reducing the detector output, when the resistance is decreased to a value that produces good linearity over the wide range of frequency deviation which is present in FM signals modulated to carry video information.

I have found that the disadvantages introduced by introducing a shunt resistance to the tuned tank of a conventional quadrature detector may be overcome by replacing the conventional tuned tank with a ferrite bead. The ferrite bead produces quadrature detection (phase shift) similar to a conventional circuit, but improves the detector power output, linearity, and selectivity.

The impedance of the ferrite bead increases as the frequency of the modulated signal increases. Most importantly, I have found that by selecting the appropriate bead material, the reactance of the bead is a near linear function of frequency. Also, the reactance of the bead increases in proportion to the square of the number of turns of wire received through the bead increases. When from 1 turn to 3 turns of between 26 gauge and 32 gauge wire are received through an Amidon type 43-101 bead, the relationship of bead reactance to frequency is similar to that of a conventional LCR circuit, without the high energy losses introduced by low values of shunt resistance required in the conventional LCR circuit. Most preferably, the use of two turns of 28 gauge, plastic insulated solid copper wire has produced excellent results, particularly when the ferrite bead has been used with a quadrature detector IC chip such as the Motorola MC1357P.

The ferrite bead detector has the additional advantage over conventional LCR tuned tank quadrature detectors, of better adjacent channel rejection (selectivity). Those skilled in the art will appreciate that the output amplitude of a conventional quadrature detector, as a function of frequency, produces a typical "S" curve. Outside of the normal detection frequency range, however, the ferrite bead quadrature detector exhibits less change in amplitude for a corresponding frequency change than the conventional LCR quadrature detector. This characteristic of the ferrite bead quadrature detector permits the operation of the satellite receiver with simultaneous input from both polarizations of the satellite broadcast signals. That is to say, the satellite broadcast signals are typically broadcast with some channels vertically polarized, and other channels horizontally polarized. In order to receive a particular channel, the TVRO antenna must be oriented to receive either vertical or horizontally polarized signals. A receiver having a ferrite bead quadrature detector in accordance with the present invention, however, can include an antenna set up to receive both horizontally and vertically oriented transmission signals equally well, and the quadrature detector hereof will be able to select only the single channel desired.

I claim:

1. A quadrature detector circuit for demodulating frequency modulated information signals having a specified center frequency, comprising:
    an input terminal for receiving said frequency modulated information signals;
    means operably coupled to said terminal for splitting said signal into a reference portion and a variable portion;
    first means for shifting the phase of said variable signal portion operably coupled to said splitting means, for shifting the phase of said variable signal portion relative to the phase of said reference signal portion by a predetermined amount of phase shift;
    second means for shifting the phase of said variable signal portion relative to said predetermined amount of phase shift in proportion to an amount of frequency change of said information signal relative to said center frequency; and
    means operably coupled to said splitting means and said first and second shifting means for detecting coincidence between said reference signal portion and said variable signal portion,
    said second phase shifting means comprising a ferrite bead and means operably coupling said bead to said first phase shifting means.

2. A detector circuit as claimed in claim 1, said bead being generally cylindrical, and said bead coupling means comprising a wire received through said bead.

3. A detector circuit as claimed in claim 2, said wire including a plurality of turns received through said bead.

4. A detector circuit as claimed in claim 1, said input terminal, said splitting means, and said coincidence detecting means being embodied in an integrated circuit chip, and said first phase shifting means and said bead being separate from and operably coupled to said chip.

5. A detector circuit as claimed in claim 4, said means operably coupling said bead to said chip comprising a wire received through said bead.

6. A detector circuit as claimed in claim 5, said center frequency being about 45 MHz, said bead being generally cylindrical, and said wire including a plurality of turns received through said bead.

7. A detector circuit as claimed in claim 6, said wire comprising two turns of about 28 gauge wire received through said bead, and having leads extending from said bead of not more than 1 centimeter.

8. A detector circuit as claimed in claim 4, said chip comprising an MC1357P integrated circuit, and said bead comprising an Amidon Type 43-101 ferrite bead.

* * * * *